(12) United States Patent
Vedantam et al.

(10) Patent No.: US 8,627,255 B2
(45) Date of Patent: Jan. 7, 2014

(54) METHODS AND SYSTEMS FOR FLEXIBLE AND REPEATABLE PRE-ROUTE GENERATION

(75) Inventors: Kiran Vedantam, Santa Clara, CA (US); James G. Ballard, Palo Alto, CA (US); Miao Rao, San Jose, CA (US); Guneet Singh, San Jose, CA (US); Wanyun Singh, Fremont, CA (US)

(73) Assignee: Oracle International Corporation, Redwood City, CA (US)

( * ) Notice: Subject to any disclaimer, the term of this patent is extended or adjusted under 35 U.S.C. 154(b) by 342 days.

(21) Appl. No.: 12/916,317

(22) Filed: Oct. 29, 2010

(65) Prior Publication Data

US 2012/0110537 A1 May 3, 2012

(51) Int. Cl.
*G06F 17/50* (2006.01)
(52) U.S. Cl.
USPC .......................................... 716/126
(58) Field of Classification Search
USPC .......................................... 716/126
See application file for complete search history.

(56) References Cited

U.S. PATENT DOCUMENTS

| | | | | |
|---|---|---|---|---|
| 5,987,086 A | * | 11/1999 | Raman et al. | 716/120 |
| 6,002,857 A | * | 12/1999 | Ramachandran | 716/122 |
| 2009/0172622 A1 | * | 7/2009 | Pyapali et al. | 716/8 |

* cited by examiner

*Primary Examiner* — Jack Chiang
*Assistant Examiner* — Brandon Bowers
(74) *Attorney, Agent, or Firm* — Polsinelli PC

(57) ABSTRACT

Methods and systems for flexible and repeatable pre-route generation are described. In one embodiment, a routing selection is received. The routing selection is for a path between at least a first cell and a second cell. The first and second cell are associated with a functional description of an integrated circuit. A floorplan associated with the functional description is modified to create a modified floorplan. The modified floorplan has a physical design change relative to the floorplan. A pre-route is automatically generated based on receipt of the routing selection and the modified floorplan. The pre-route is added to a physical design of the chip to create a pre-routed physical design. Additional methods and systems are disclosed.

18 Claims, 17 Drawing Sheets ated circuit or "chip" is through a design process. Floorplanning is a part of the chip design process in which cells or instances (integrated circuit implementation of some logical or electronic function) are positioned relative to other cells, and space is allocated for the cells. A given floorplanning often involves a balance between available space (cost of the chip), required performance, and a need to have certain cells in close proximity of other cells.

METHODS AND SYSTEMS FOR FLEXIBLE AND REPEATABLE PRE-ROUTE GENERATION

FIELD

This application relates to methods and systems for designing chips, and more specifically to methods and systems for pre-route generation for chip design.

BACKGROUND

A physical design for an integrated circuit or "chip" is created through a design process. Floorplanning is a part of the chip design process in which cells or instances (integrated circuit implementation of some logical or electronic function) are positioned relative to other cells, and space is allocated for the cells. A given floorplanning often involves a balance between available space (cost of the chip), required performance, and a need to have certain cells in close proximity of other cells.

The routing for the cells (i.e., the connections or wiring between cells) associated with the physical design may be created through a custom design process or may be automatically drawn by software tools. The custom design process involves a person drawing the wires for the physical design of the chip in a layout mode. When the routing is hand drawn, changes to the design may require significant changes to the routing and thereby cause significant additional work by the person performing the drawing. Software routing, on the other hand, typically makes a number of trade-offs based on a number of factors or constraints to generate the routes for the physical design of the chip.

SUMMARY

In one aspect, a method involves receipt of a routing selection. The routing selection is for a path between at least a first cell and a second cell that are associated with a functional description of an integrated circuit. The method further involves modifying a floorplan associated with the functional description to create a modified floorplan that has a physical design change relative to the floorplan. The method then further involves automatically generating a pre-route based on receipt of the routing selection and the modified floorplan. The pre-route may have the same path and/or the same performance as the path associated with the routing selection. The method then further involves adding the pre-route to a physical design of the chip to create a pre-routed physical design. The pre-route is generated and added to the physical design by the method prior to generation and addition of a plurality of additional floorplan routes to the physical design. The pre-route may be a trunk and the plurality of additional floorplan routes may be a plurality of branches associated with the trunk.

In another aspect, a system includes a processor coupled to a memory. The system includes a route selection module deployed in the memory and executed by the processor to receive a routing selection. The system further includes a floorplan module deployed in the memory and executed by the processor to modify a floorplan associated with the functional description to create a modified floorplan having a physical design change relative to the floorplan. The functional description may be in netlist format. The system further includes a pre-routing module deployed in the memory and executed by the processor to automatically generate a pre-route based on receipt of the routing selection and the modified floorplan. The system further includes a route addition module deployed in the memory and executed by the processor to adding the pre-route to a physical design of the chip to create a pre-routed physical design.

DETAILED DESCRIPTION

Figure 1:
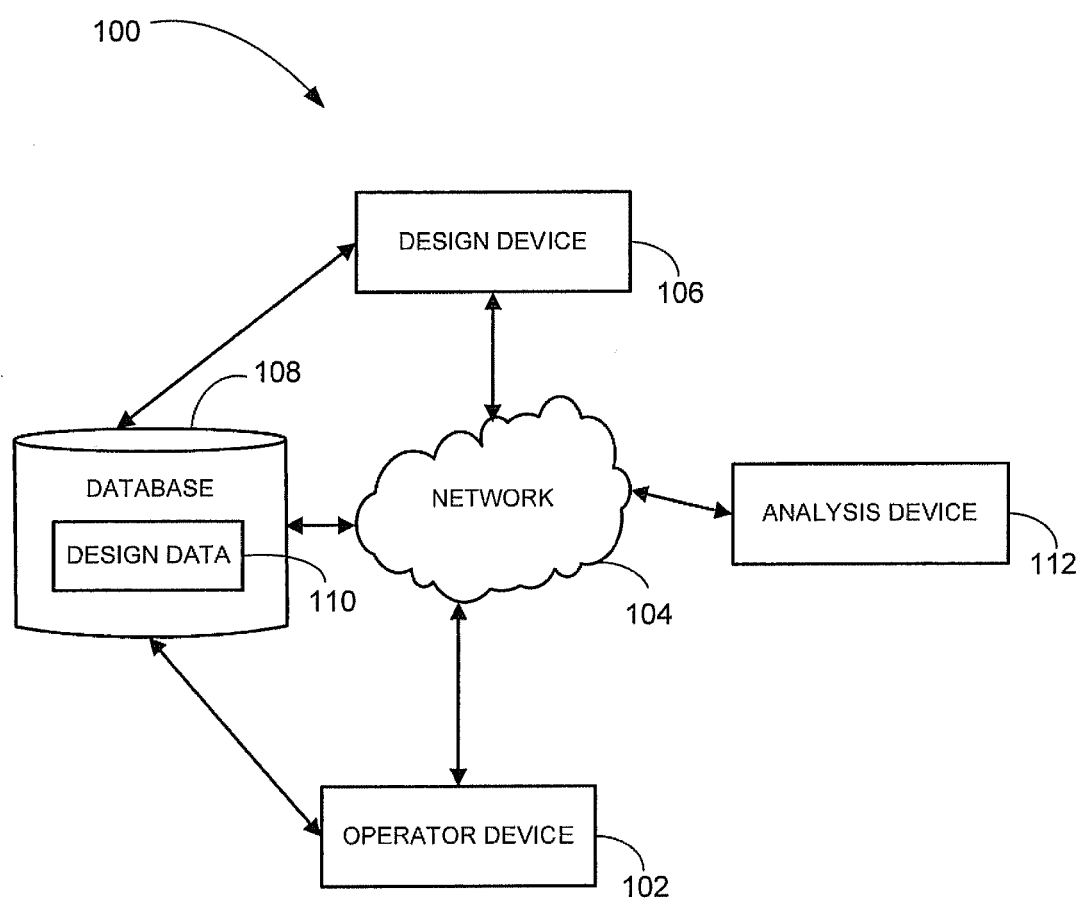
FIG. 1 is a block diagram of an example system, according to an example embodiment.

Aspects of the present disclosure involve methods and systems for flexible and repeatable pre-route generation. Paths may be selected for route generation prior to the generation of other routes. The generation and addition of these selected routes pre-route the physical design of a chip.

At the outset of designing a new chip, a functional description for the chip is created. The functional description generally specifies a number of cells that enable the chip to provide certain desired functionality. The cells of the chip typically provide the integrated circuit description for gates, invertors, flip-flops, and other functional components of the chip. For example, routing provides the connections between cells such that wires are connected to pins of the cells.

Certain routes are selected from floorplans for pre-routing and are given precedence over non-selected paths. These route selections are prioritized in that resources on the chip are allocated for the pre-routes prior to the routes for which route selections have not been received.

Rules may be specified to enable automated drawing of pre-routes. The rules may enable an operator of the automation tool to ensure that certain requirements of the routes and/or the chip design itself are met. A given pre-routing rule may include a style that is defined as a single shape or a combination of shapes that constitute the path of the route. The path represents the wire used to connect cells of the chip. The shape or shapes that constitute the style constitute the two dimensional appearance of the path.

Throughout the design process the floorplan will be modified, and as the floorplan is modified, pre-routes will continue to be generated or modified and added to the modified chip design despite floorplan modification. The pre-routes may have the same paths as the routes that were selected in the floorplan, or may be paths that are not the same but are still based on the paths in the floorplan. In general, the paths of the pre-routes are not the same as the paths associated with the routing selection. Instead, the paths of the pre-routes are modified based on the differing position of the cells maintaining a same or similar topology to the path of the original route selection. In addition, the paths of the pre-routes generally have at least substantially the same performance as the paths of the previously selected routes. The performance of a given path involves, by way of example, timing behavior, power, noise, and/or electro-migration. Thus, the paths of the pre-routes may be used in the physical design of the chip despite a physical design change to the floorplan.

In some embodiments, the methods and systems discussed herein enable an acceptable design solution to be identified earlier in the design process. For example, an operator may expend less time to create a routed physical design of the chip. Using less time, more and faster iterations of the routing of the physical design may be tried until an acceptable design solution is identified.

In some embodiments, the methods and systems enable pre-routes to be generated that meet a performance specification. For example, while automatic routing of a physical design of a chip may not meet performance specification because routes do not meet appropriate timing, the methods and systems can be used to ensure that the performance specification is met for all routes of the physical design.

The pre-routes may be flexible in that they may accommodate changing of the floorplans without re-defining the pre-routes. In some embodiments, the pre-routes may be replicated or may be similar to a selected route despite changes made to the floorplans. Similar routes generally have the same route characteristics despite having a changed floorplan. In some embodiments, the pre-routes are consistent, flexible, and repeatable while accommodating at least some amount of floorplan changes.

Further the pre-routes may improve the ability to meet constraints associated with a chip. Finally, automatic generation of pre-routes may be performed despite changes to the physical design.

FIG. 1 illustrates an example system 100 in which flexible and repeatable pre-route generation may be performed. The system 100 is an example platform in which one or more embodiments of the methods may be used. However, the flexible and repeatable pre-route generation may also be performed on other platforms.

An operator may perform the flexible and repeatable pre-route generation by using the operator device 102. The operator may use the operator device 102 as a stand-alone device to perform the flexible and repeatable pre-route generation, or may use the operator device 102 in combination with a design device 106 available over a network 104. When the design device 106 is used in the system 100, in general at least a portion of the functionality that generates flexible and repeatable pre-routes is performed on the design device 106.

The operator device 102 may be in a client-server relationship with the design device 106, a peer-to-peer relationship with the design device 106, or in a different type of relationship with the design device 106. In one embodiment, the client-service relationship may include a thin client on the operator device 102. In another embodiment, the client-service relationship may include a thick client on the operator device 102.

The network 104 over which the operator device 102 and the design device 106 may communicate include, by way of example, a Mobile Communications (GSM) network, a code division multiple access (CDMA) network, 3rd Generation Partnership Project (3GPP), an Internet Protocol (IP) network, a Wireless Application Protocol (WAP) network, a WiFi network, or an IEEE 802.11 standards network, as well as various combinations thereof. Other conventional and/or later developed wired and wireless networks may also be used.

The operator may directly or indirectly control or operate the operator device 102, the design device 106, or both.

In one embodiment, the devices of the system 100 may each be a single device or may each include multiple devices. For example, the design device 106 may include multiple computer systems in a cloud computing configuration.

The operator device 102, the design device 106, or both may communicate with a database 108. The database 108 may include design data 110 and, in some embodiments, other data. The design data 110 stored in the database 108 may include, by way of example, floorplan data, floorplan route selection data, physical design data, rule data, and/or functional description data.

An analysis device 112 may be deployed in the system 100 and be in communication with the operator device 102, the design device 106, or both to perform route selection. The route selection performed by the analysis device 112 may be based on an algorithm or an algorithm that has been configured by the operator.

Figure 2:
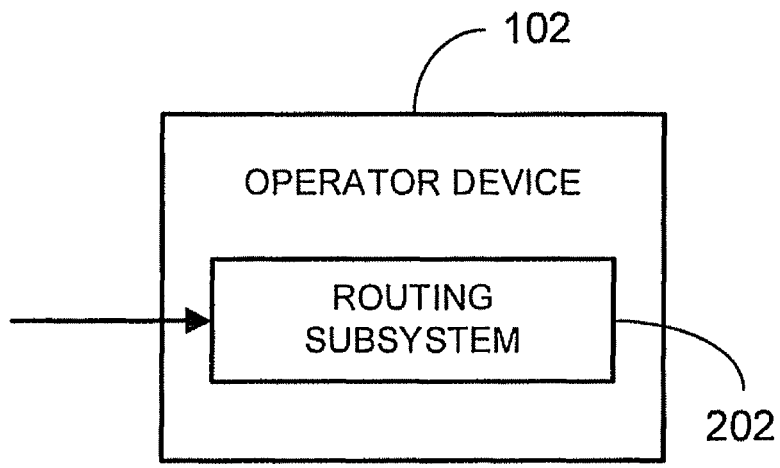
FIG. 2 is a block diagram of an example operator device that may be deployed within the system of FIG. 1, according to an example embodiment.

FIG. 2 illustrates an example operator device 102 that may be deployed in the system 100 (see FIG. 1), or otherwise deployed in another system. The operator device 102 is shown to include a routing subsystem 202. The routing subsystem 202 receives a route selection of a route that has a path between cells and generates and adds a pre-route to a physical design of a chip to pre-route the physical design.

In some embodiments, the routing system 202 is a single subsystem while in other embodiments the routing system 202 is multiple subsystems. For example, a first subsystem may be deployed as a pre-routing tool and a second subsystem may be deployed as a detailed router or industrial router. In one embodiment, the pre-routing tool generates and adds the pre-routes to the physical design before the detailed router generates and adds the remaining routes to the pre-routed physical design.

Figure 3:
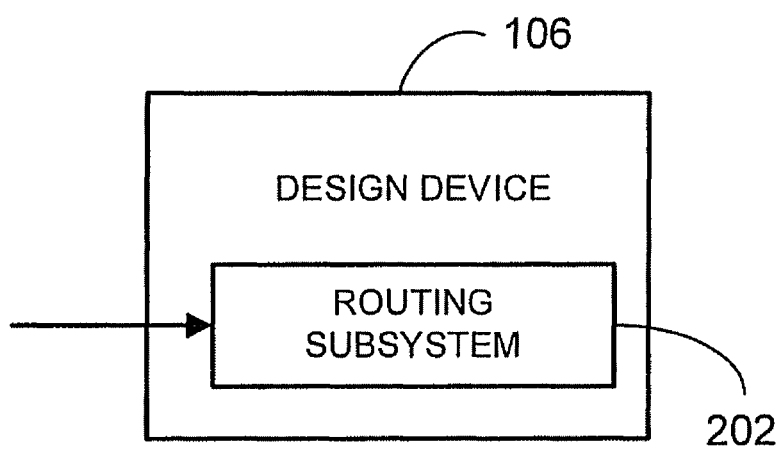
FIG. 3 is a block diagram of an example design device that may be deployed within the system of FIG. 1, according to an example embodiment.

FIG. 3 illustrates an example design device 106 that may be deployed in the system 100 (see FIG. 1), or otherwise deployed in another system. The design device 106 is shown to include the routing subsystem 202 (see FIG. 2).

Figure 4:
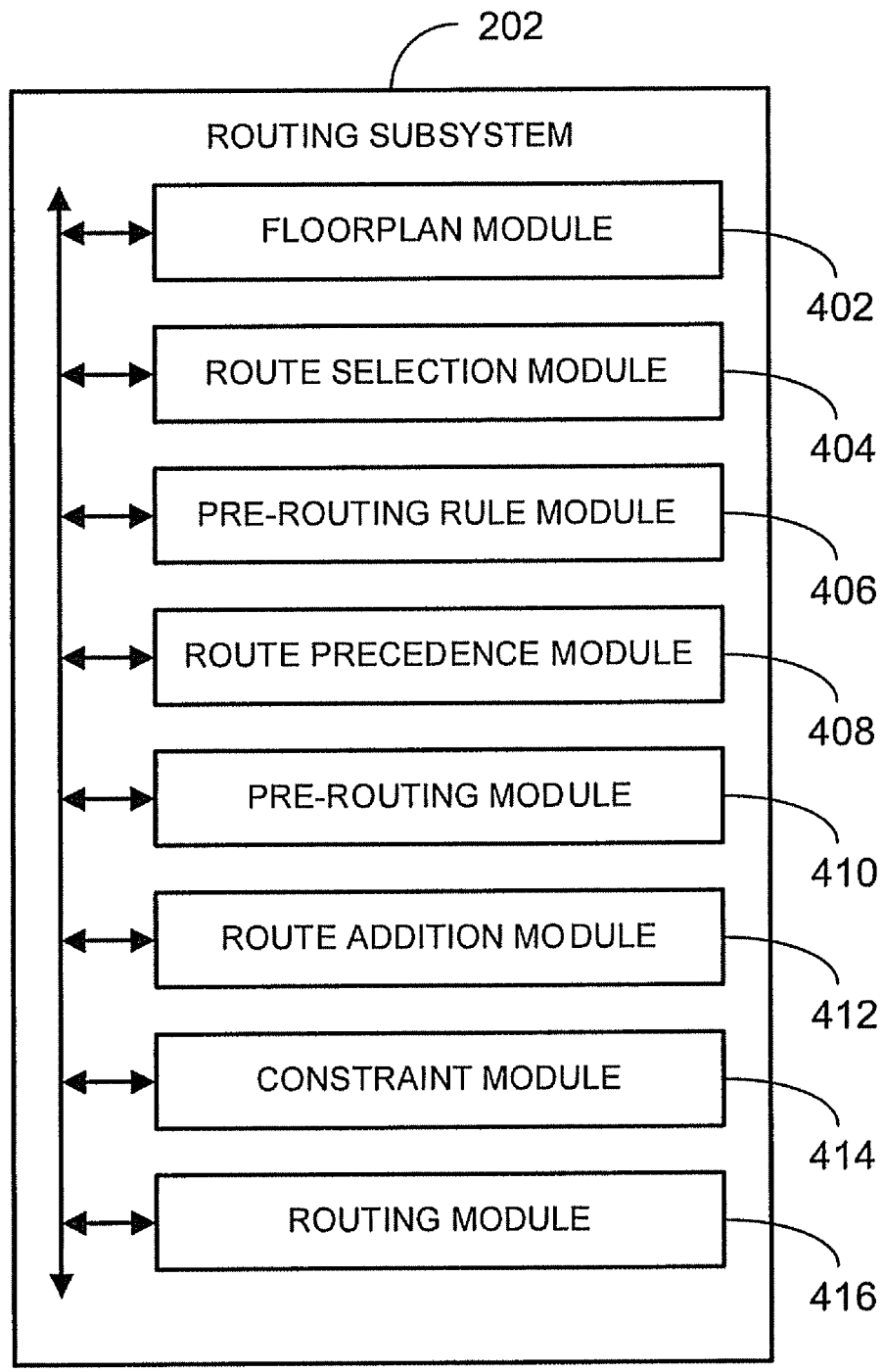
FIG. 4 is a block diagram of an example routing subsystem that may be deployed within the operator device of FIG. 2 or the design device of FIG. 3, according to an example embodiment.

FIG. 4 illustrates an example routing subsystem 202 that may be deployed in the operator device 102, the design device 106, or otherwise deployed in another system. One or more modules are included in the routing subsystem 202 to route a physical design of a chip. The modules of the routing subsystem 202 that may be included are a floorplan module 402, a route selection module 404, a pre-routing rule module 406, a route precedence module 408, a pre-routing module 410, a route addition module 412, a constraint module 414, and a routing module 416. Other modules may also be included. In various embodiments, the modules may be distributed so that some of the modules may be deployed in the operator device 102 and some of the modules may be deployed in the design device 106. In one particular embodiment, the routing subsystem 202 includes a processor, memory coupled to the processor, and a number of the aforementioned modules deployed in the memory and executed by the processor.

The routing subsystem 202 may be implemented in a number of different ways. For example, the routing subsystem 202 may be implemented as an add-on or an extension to otherwise available software, hardware, or both. The routing system 202 may be deployed as stand-alone software, hardware, or a combination of both.

In general, routing of the physical design of the chip begins with the floorplan module 402 receiving the functional description of the chip design. The floorplan module 402 may then use the functional description to generate the floorplan. The floorplan module 402 may display the generated floorplan.

The functional description describes the size of the chip, the operations or tasks that the chip is intended to perform, as well as constraints of the chip (e.g., power consumption). The functional description also identifies cells and connections between the cells. Placement of wires relative to the location of other wires that connect the cells and/or shield on whether certain wires need to be protected from other wires may be identified in the functional description. The functional description may be in netlist format or in a different format. In some embodiments, the floorplan module 402 codes the functional description into register transfer language (RTL).

As the design of the chip evolves, the functional description of the chip may be modified. The functional description, when provided in netlist format or another format, may be verified by the operator, the floorplan module 402, or both, to determine whether the functional description is acceptable. If a determination is made that the functional description is unacceptable (e.g., there is an error in the functional description), the modification to the functional description may cause the operator to change the design.

The floorplan generated by the floorplan module 402 is a schematic representation of the placement of the cells and describes how cells lie in relation to one another.

After generation of the floorplan, the route selection module 404 receives a routing selection of a path between cells (e.g., a path between a first cell and a second cell) of the floorplan.

The selected routes are floorplan routes that are selected for pre-routing and are thus prioritized above other routes that are generated in the routing process. A topology of the physical design identifies the pins of the cells and the routing in the form of horizontal positioning of the path, the vertical positioning of the path, and the layer selection of the path. These pre-routes are generated to reflect the appropriate routing and are added to a physical design of the chip prior to the generation and addition of other floorplan routes that have not been selected for pre-routing. The physical design, once completed with cells and routings, may be used to manufacture the chip.

The floorplan routing selection may be received by the route selection module 404 from the operator (e.g., through a user interface), through the analysis device 112, through the operator device 102, through the design device 106, or otherwise received. A single floorplan routing selection or multiple floorplan routing selections may be received by the route selection module 404.

The floorplan routing selection, when received from the analysis device 112, may be received as a result of analysis of the floorplan by the analysis device 112. The analysis device 112 may receive and use the functional description of the chip to perform floorplan routing selection. For example, the analysis device 112 may automatically (e.g., without human intervention) perform simulations to identify the floorplan routing that takes the longest amount of time for a signal to traverse the path and may make the floorplan routing selection based on the identification. In some embodiments, the operator of the analysis device 112 (or another user) may set a timing threshold so that certain paths above, below, and/or equal to the threshold are pre-routed. In some embodiments, the selected routing (the pre-routes) are critical nets that are timing critical and non-selected routing are non-critical nets that are not timing critical.

A pre-routing rule may be established for the selected routing by the pre-routing rule module 406. The pre-routing rule defines the pre-route for routing prior to non-selected routes. When multiple routes are selected by the route selection module 404, multiple pre-routing rules may be established by the pre-routing rule module 406. In some embodiments, the pre-routing rules are not modified despite changes to the floorplan.

For example, the pre-routing rule may indicate that the route or path between certain cells has a turn (e.g., a right turn). The pre-routing rule may provide flexibility on where the turn will occur in the path between the cells.

The pre-routing of cells may be defined by one or a series of routing shapes. The routing shapes used in a series may be offset relative to one another based on the current position of the cells. When the position of the cells change, the offset may automatically be modified in a corresponding manner.

In some embodiments, the pre-routing rule includes a single shape or multiple shapes of the path. A route shape is associated with a particular style or styles. For example, a particular style may include a first set of shapes and another style may include a different set of shapes. Examples of shapes that may be used with a style include a line, an L-shape or a Z-shape.

The pre-routing rule may further define the topology of the path by route layers, route width, route spacing (e.g., minimum spacing), and/or route grid. The route spacing may indicate how close and/or far apart paths can be from one another. The route grid indicates a set of route tricks which define a space in which a wire placed is allowed. For example, the pre-routing rule may indicate that the path passes through two layers, that the path is two units thick, that no other path may be within one unit of the path, and an acceptable location where the path may be drawn. A route shape may have its own route layers, route width, route space, and route grid.

The floorplan module 402 modifies a floorplan associated with the functional description. Generally, the floorplan is modified by repositioning one or more of the cells of the floorplan. However, the floorplan may also be changed by adding or removing cells. The resulting modified floorplan has a physical design change relative to the previous version of the floorplan.

In some embodiments, the floorplan module 402 may modify the floorplan based on a determination that the floorplan has an error, that the floorplan does not meet a performance specification, or both. For example, the error may be a bug in the netlist and the fixing of the bug may change the chip design on which the floorplan is based. For example, the bug may be a placement of a cell that would cause the resulting chip to not provide the desired functionality and the cell placement would then be modified in the floorplan by the floorplan module 402. The performance specification may include the speed or timing of the chip design. The determination of the floorplan error or timing issue may be made by the floorplan module 402, the operator interacting with the routing subsystem 202, or may otherwise be made.

The modification of the floorplan by the floorplan module 402 may change the length of the pre-routes that are generated by the pre-routing module 410. The pre-routes generally adjust to changes made to the floorplan because by having defined route styles for the paths between certain cells of the floorplan, the exact cell placement in the floorplan may be modified and yet the resulting pre-routes are still generated. Thus, for example, when a floorplan is first generated, a route between cell A and cell B is selected for pre-routing because it is a critical path. When the floorplan is modified, the position of cell B is moved. Prior to routing the entire floorplan, pre-routes, such as the routing selection between cell A and cell B, are first checked to determine if a new or modified route is needed. A different path between cell A and cell B is generated to account for the new position of cell B (as well as any other cell changes) accordingly to the role established for the pre-route. Hence, if the path between cell A and cell B is in an L-shape, that L-shape is maintained in the modified route.

In some embodiments, some aspect of the modification of the floorplan may prohibit the automatic generation of some or all of the pre-routes. For example, positioning of cells in the chip could be so dramatically different that the pre-routes cannot be generated without modification to the pre-routing rules. The operator may be notified of the failure to perform the automatic generation. The operator may then modify the floorplan, the pre-routing rule, select other or new routes for prerouting, or take a different action with respect to the floorplan if desired.

The route precedence module 408 may be deployed in the routing subsystem 202 to determine route precedence of the modified floorplan. The route precedence of the routes of the modified floorplan may be automatically determined, or may be identified by a user (e.g., the operator) in a routing file that is accessed by the route precedence module 408. By way of example, the route precedence module 408 may scan the routing file that includes routing rules for the cells of the floorplan and process the routing rules in priority order from highest priority to lowest priority.

The pre-routing module 410 generates the pre-routes. A pre-route generated for a modified floorplan, where the placement of cells for the pre-route does not change, will have all of the same characteristics as the originally selected route as the modified floorplan required no change for the particularly selected route. When the positions of some of the cells have changed, the generated pre-routes will be similar, due to the pre-routing rules, to the previously generated routes that were selected for pre-routing. In some embodiments, the pre-routes are automatically generated. In some embodiments, the creation of the pre-route includes a set of one or more routing shapes defined by a style or shape type.

By way of example, if a cell A moves, and cell A is connected to cell B with an L route, the L route is modified (e.g., vertical distance of the path becomes a bit longer) to reflect the new positioning of cell A.

The route addition module 412 then adds the pre-routes to a physical design of the chip to create a pre-routed physical design. In some embodiments, the pre-routing of the pre-routes by the pre-routing module 410 and the route addition module 412 enable reproduction of the pre-routes despite changes to the floorplan. The changes may include changes in position of the cells that have been pre-routed. In one embodiment, the routes selected for routing include trunks, and routes that are not selected for routing include interconnections that connect to the trunks. In general, trunks route higher priority data in a chip while interconnections connect and route lower priority data in the chip. For example, a trunk may be designed to handle simultaneous signals while the interconnections do not handle such data.

When a pre-routing rule has been established, generation of the pre-routes is based on establishment of the pre-routing rule and the modification of the floorplan.

In some embodiments, the constraint module 414 accesses routing constraints. While the pre-routing rule generally describes the path taken by the route, the routing constraints describe characteristics of the route or define conditions that particular routes are expected to meet. The generation of the pre-routes is then also based on any applicable routing constraints. Examples of routing constraints including route timing, route power, and route noise. For example, the pre-routing rule may define the shape of the path between two cells and the routing constraints define an acceptable amount of signal that may interfere with the signal being transmitted on the path. Pre-routing may enable the routing constraints to be met on the pre-routes despite changes made to the floorplan.

After pre-routing the physical design, additional floorplan routes are generated by the routing module 416 based on the modified floorplan. Typically, the floorplan routes are lower priority routes then the generated pre-routes. The route addition module 412 then adds the additional floorplan routes to the pre-routed physical design of the chip. The pre-routes are typically not modified or replaced by the additional floorplan routes. The additional routes generated by the routing module 416 may be auto-constructed such that operator input is not need to complete the routing of the chip.

The resulting physical design of the chip that includes circuit representations of the components (devices and interconnects) may then be converted into geometric representations of shapes which, when manufactured in the corresponding layers of materials, may ensure the desired functioning of the components.

Figure 5:
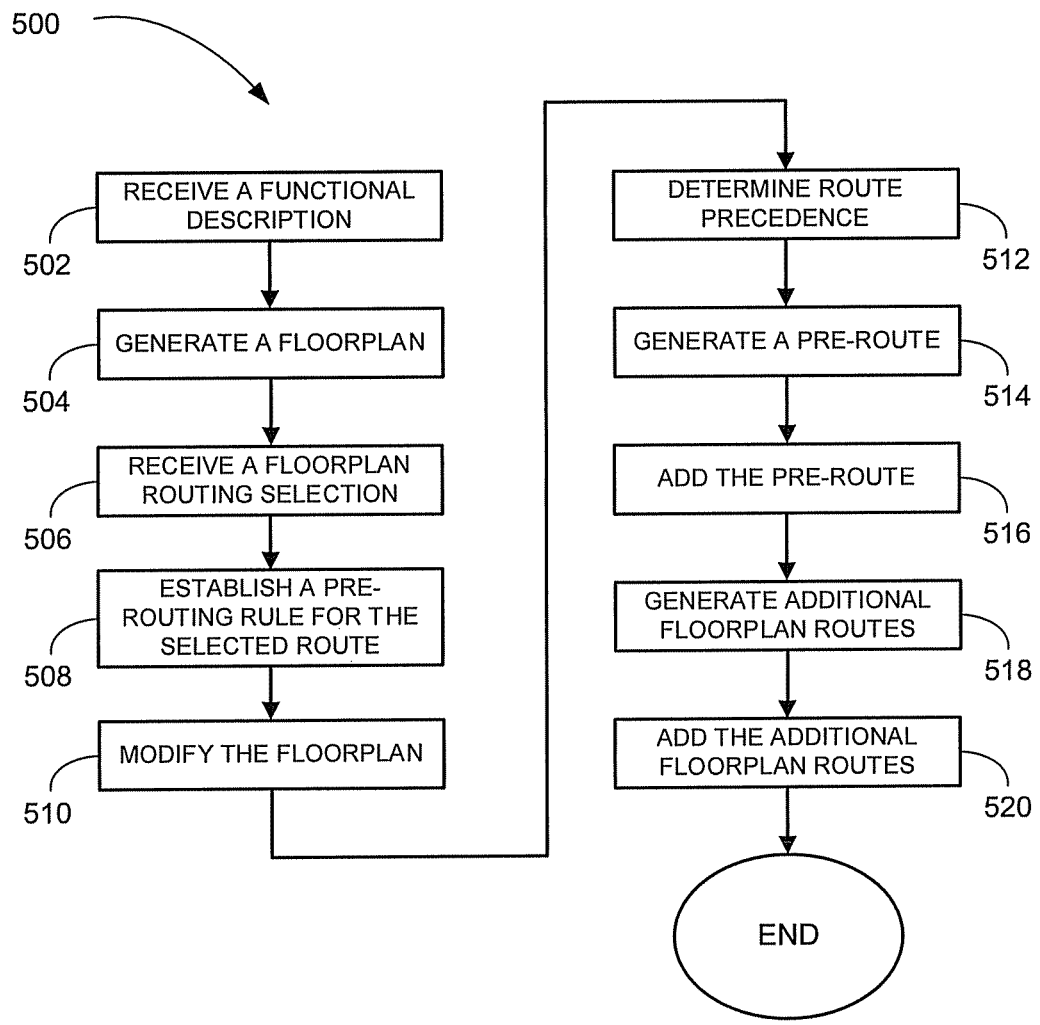
FIG. 5 is a flowchart illustrating a method for pre-routing, according to an example embodiment.

FIG. 5 illustrates a method 500 for pre-routing according to an example embodiment. The method 500 may be performed by the operator device 102 or the design device 106 of the system 100 (see FIG. 1), or may be otherwise performed. For simplicity the method 500 describes a single pre-route, and associated systems and methods. However, the method 500 may be used to generate and use multiple pre-routes sequentially, simultaneously, or otherwise.

A functional description associated with the chip design may be received at block 502. The floorplan may be generated based on the functional description at block 504.

A floorplan routing selection is received at block 506. The route selected for pre-routing is for a path between a first cell and a second cell associated with a functional description. The floorplan routing selection may be received from the operator, the analysis device 112, or otherwise received. For example, a route between cell A and cell B may be selected.

A pre-routing rule may be created based on receipt of the routing selection at block 508. For example, the pre-routing rule may be a rule to generate a pre-route for a path between cell A and cell B.

A floorplan associated with the functional description is modified at block 510 to create a modified floorplan. The modified floorplan has a physical design change relative to the floorplan. In some embodiments, the modification includes modifying placement of a single cell or multiple cells of the floorplan of the chip design. For example, the position of cell A may move in the floorplan.

A determination of route precedence of the modified floorplan may be made at block 512. The pre-routes that have been selected have greater route precedence than non-selected routes.

A pre-route is generated at block 514 based on receipt of the routing selection and the modified floorplan. In general, the generated pre-route is based on the route selected for pre-routing in that the pre-route may have the same path as the route selected by the routing selection or may be an altered path based on the modifications made to the floorplan. In some embodiments, the pre-route is a flexible pre-route in that the path of the pre-route adjusts with the repositioning of cells. For example, the pre-route between cell A and cell B may be generated. Even though the cell A has moved, the pre-route that includes a path between cell A and cell B may still be generated. In some embodiments, the pre-route is automatically generated without human interaction.

In some embodiments, routing constraints are accessed and the generation of the pre-route is then based on the receipt, the modification, and the routing constraints. In one particular example, generation of pre-route is based on establishment of a pre-routing rule for the selected route, establishing one or more constraints for the route, and the modification of the floorplan.

At block 516, the pre-route is added to a physical design of the chip to create a pre-routed physical design.

Once the physical design of the chip is pre-routed by the method 500, additional floorplan routes may be generated based on the modified floorplan at block 518. The additional floorplan routes may then be added to the pre-routed physical design of the chip at block 520. The addition and generation of the additional floorplan routes during the operations performed at blocks 518, 520 may complete the routing of the chip design.

In some embodiments, the determination of route precedence of the modified floorplan made at block 512 may affect the generation and/or addition of routes during the operations performed at blocks 514-520.

In some embodiments, the operations performed at blocks 510-520 may be continually performed to create iterations of a further modified floorplan. The pre-routes may continue to be generated despite the continued modifications made to the floorplan.

FIGS. 6-10 illustrate example route shapes, according to example embodiments. A single route shape or multiple route shapes are a route style and may constitute the path between cells. In some embodiments, a routing rule for a particular route may define which of the shapes may be used.

The route shapes of FIGS. 6-10 are shown in an arbitrary plane. In this plane, the paths are arbitrarily described as being vertical and horizontal. However, other planes at different with different prospective views may be used. The shapes in these planes may be rotated in a wide variety of angles.

Figure 6:
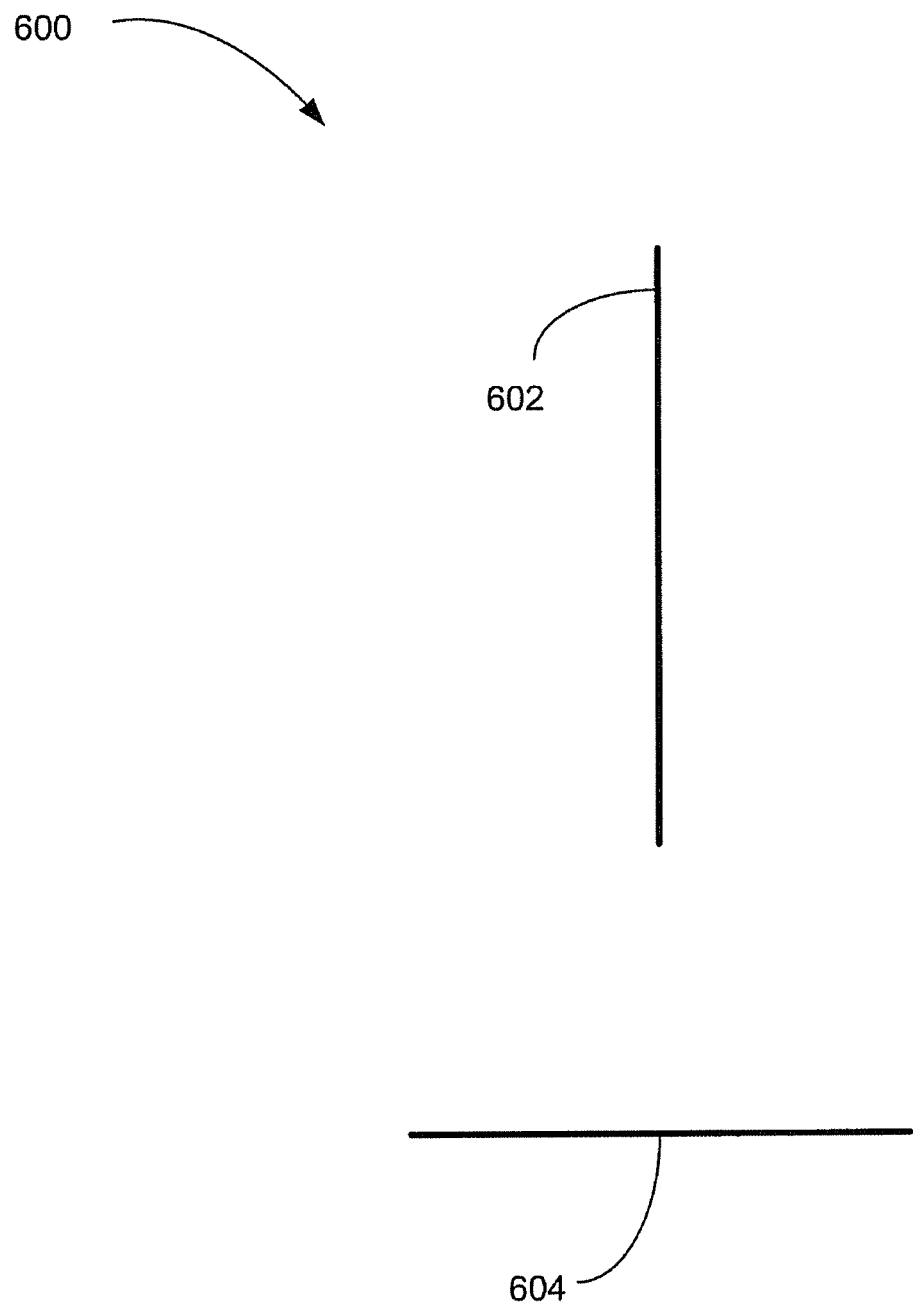
FIGS. 6-10 are illustrations of example route shapes, according to example embodiments.

The styles of route shapes 600 shown in FIG. 6 are examples of line shapes and include a vertical to vertical aligned route shape 602 and a horizontal to horizontal aligned route shape 604. The lines may implemented in a single plane as shown, or may be implemented such that a portion of the path is on a first plane, a portion of the path is on a second plane, and another portion of the path connects the portions of the lines on the different planes. The segments of other shapes may similarly be implemented on one plane or multiple planes.

Figure 7:
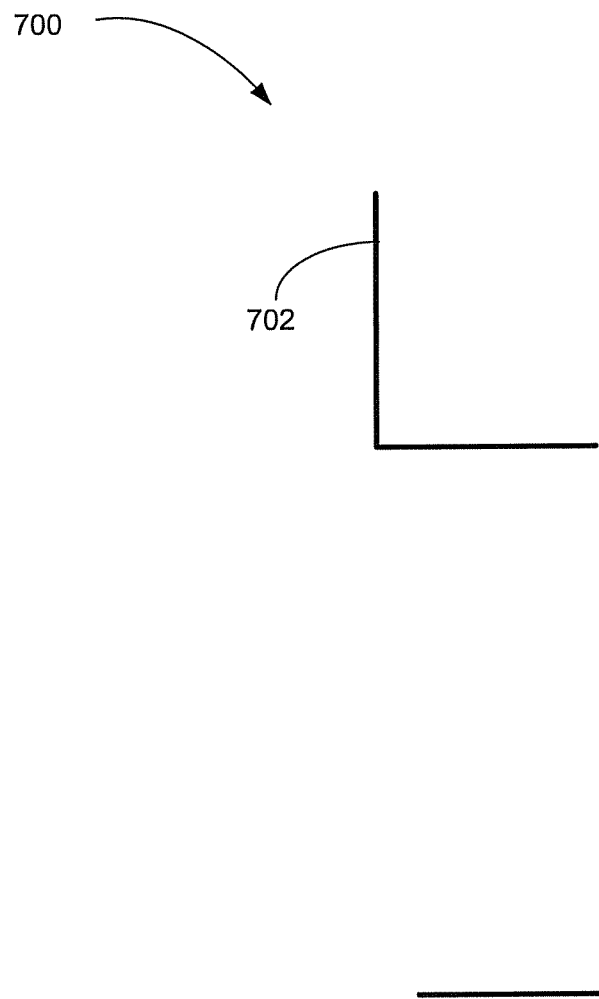
Figure 8:
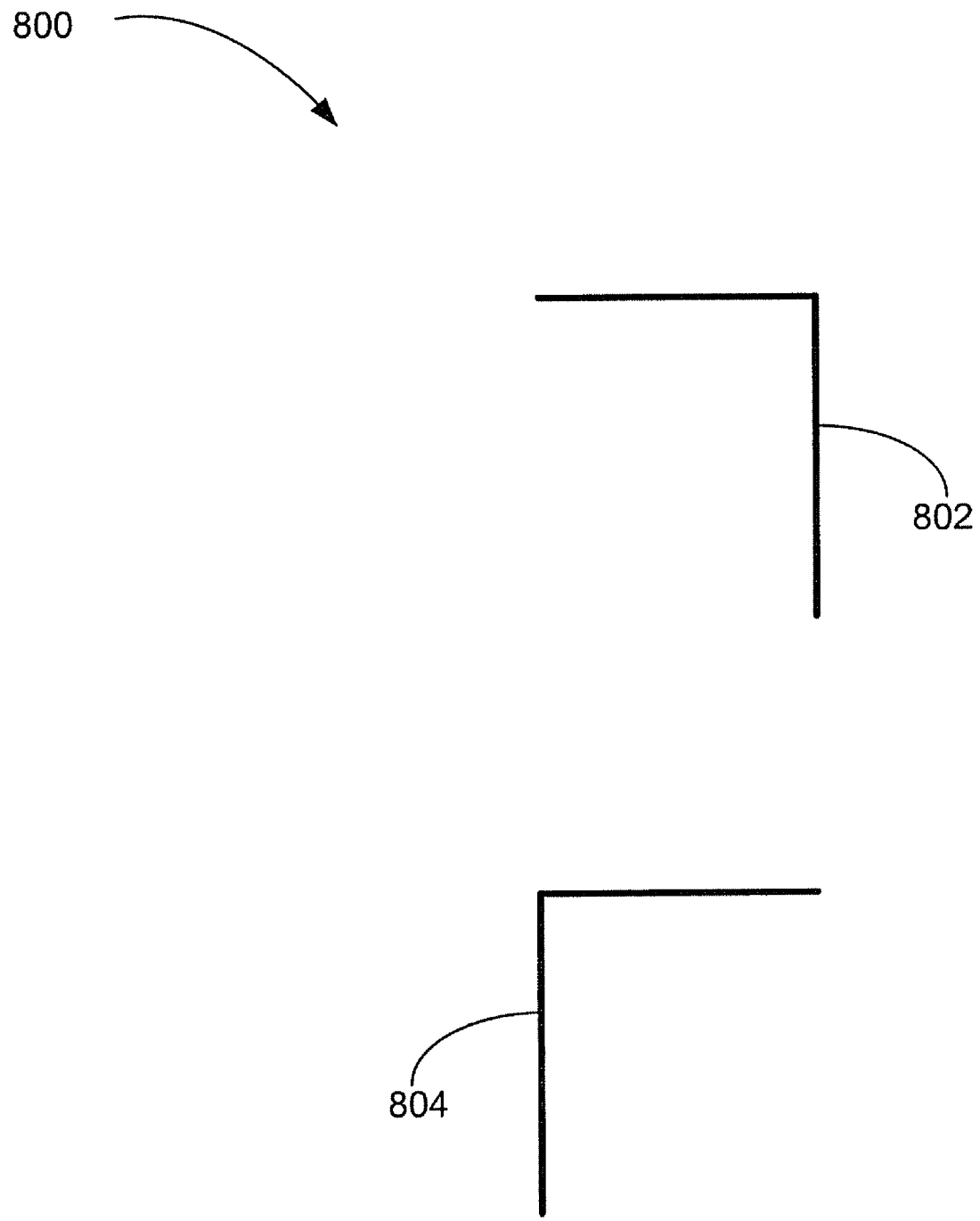

In FIG. 7, the styles of route shapes 700 are examples of L shapes and include a horizontal row to vertical shape 702 and a horizontal row to vertical shape 704. The route shapes 700 are shown inverted as route shapes 800 in FIG. 8. Thus the route shapes 800 include an inverted horizontal row to vertical shape 802 and an inverted horizontal row to vertical shape 804.

Figure 9:
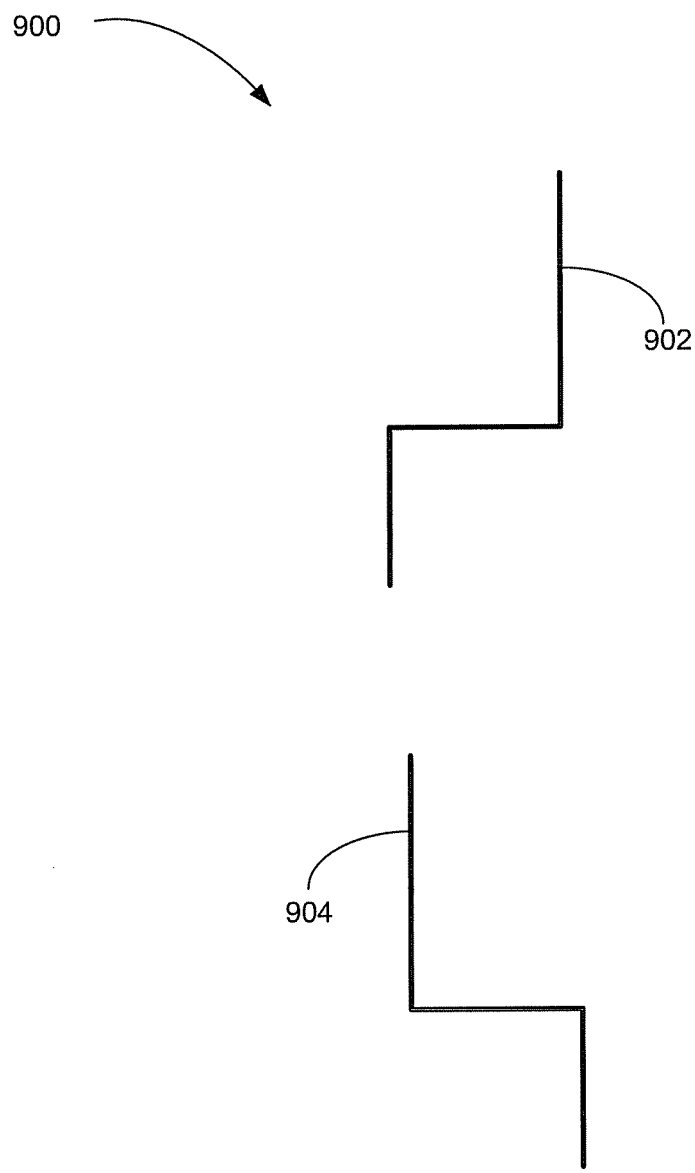

The styles of route shapes 900 shown in FIG. 9 are examples of Z shapes and include vertical to vertical unaligned route shapes 902, 904.

Figure 10:
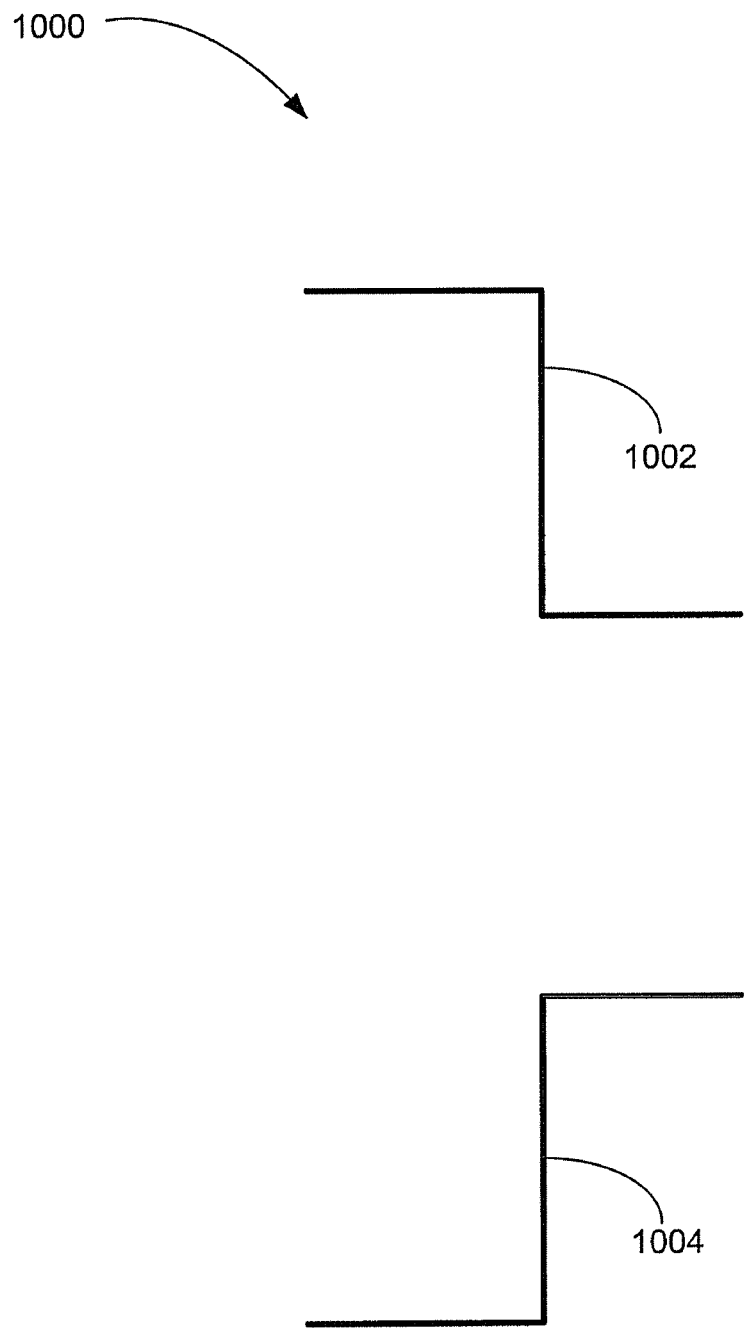

The route shapes 1000 of FIG. 10 are shown as rotated versions of the route shapes 900 in FIG. 9. Thus the route shapes 1000 include horizontal to horizontal unaligned shapes 1002, 1004. While the FIGS. 6-10 show various route shapes 600-1000, other or different route shapes may be used.

FIGS. 11-17 illustrate example cell placements 1100-1700, according to example embodiments. The placements may be used within an integrated circuit. These figures provide an example of how once pre-routing has been established, that routing of the path between cells can continue to be performed despite changes to the floorplan.

Figure 11:
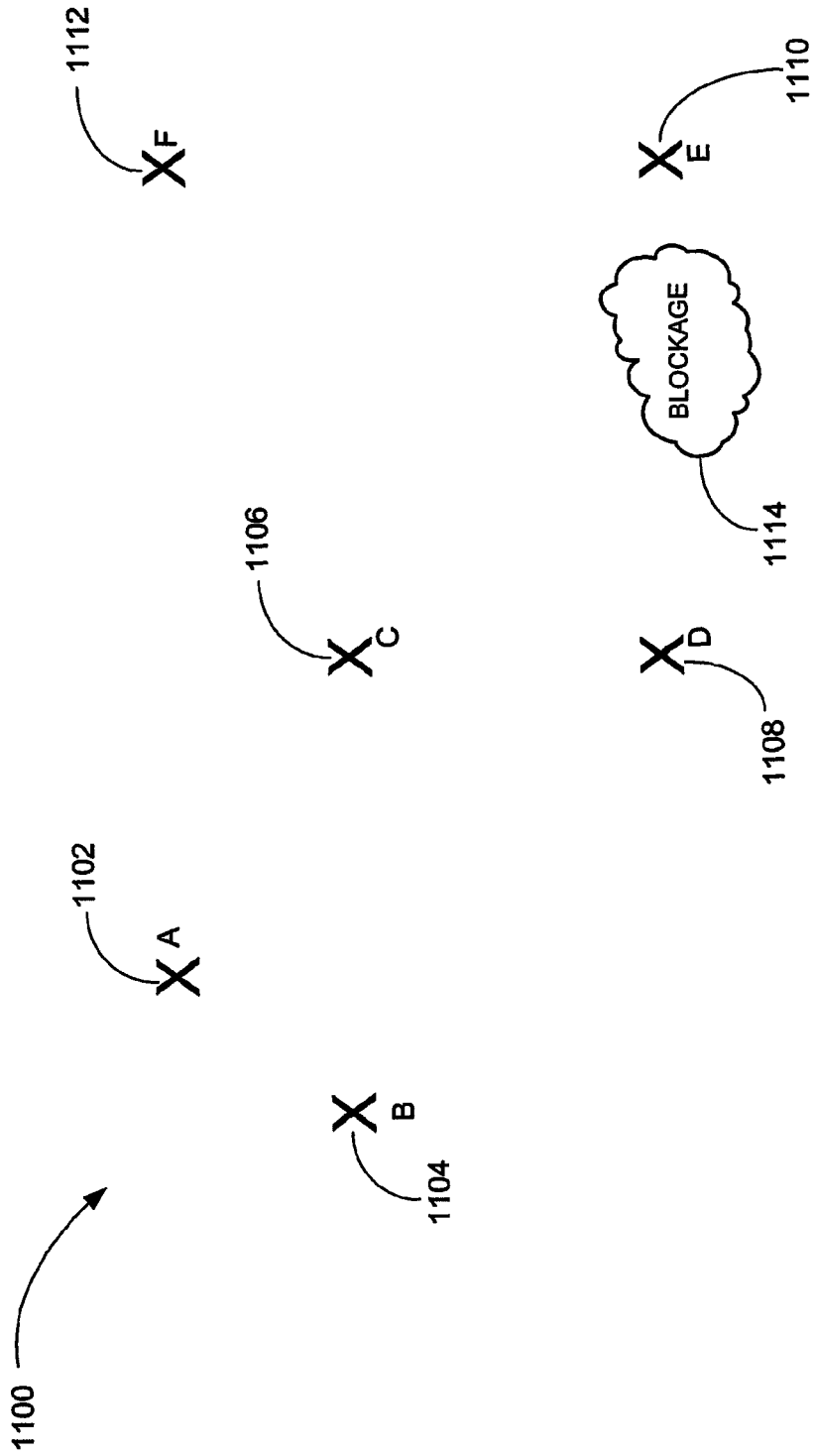
FIGS. 11-17 are illustrations of example cell placements, according to example embodiments.

A cell placement 1100 is shown in FIG. 11 to include a cell A 1102, a cell B 1104, a cell C 1106, a cell D 1108, a cell E 1110 and a cell F 1112. A block 1114 is also shown. Of the cells 1102-1114, all are to be connected by pre-routes except for cell F 1112. F is determined not to be critical and therefore is not a selected route for pre-routing.

Figure 12:
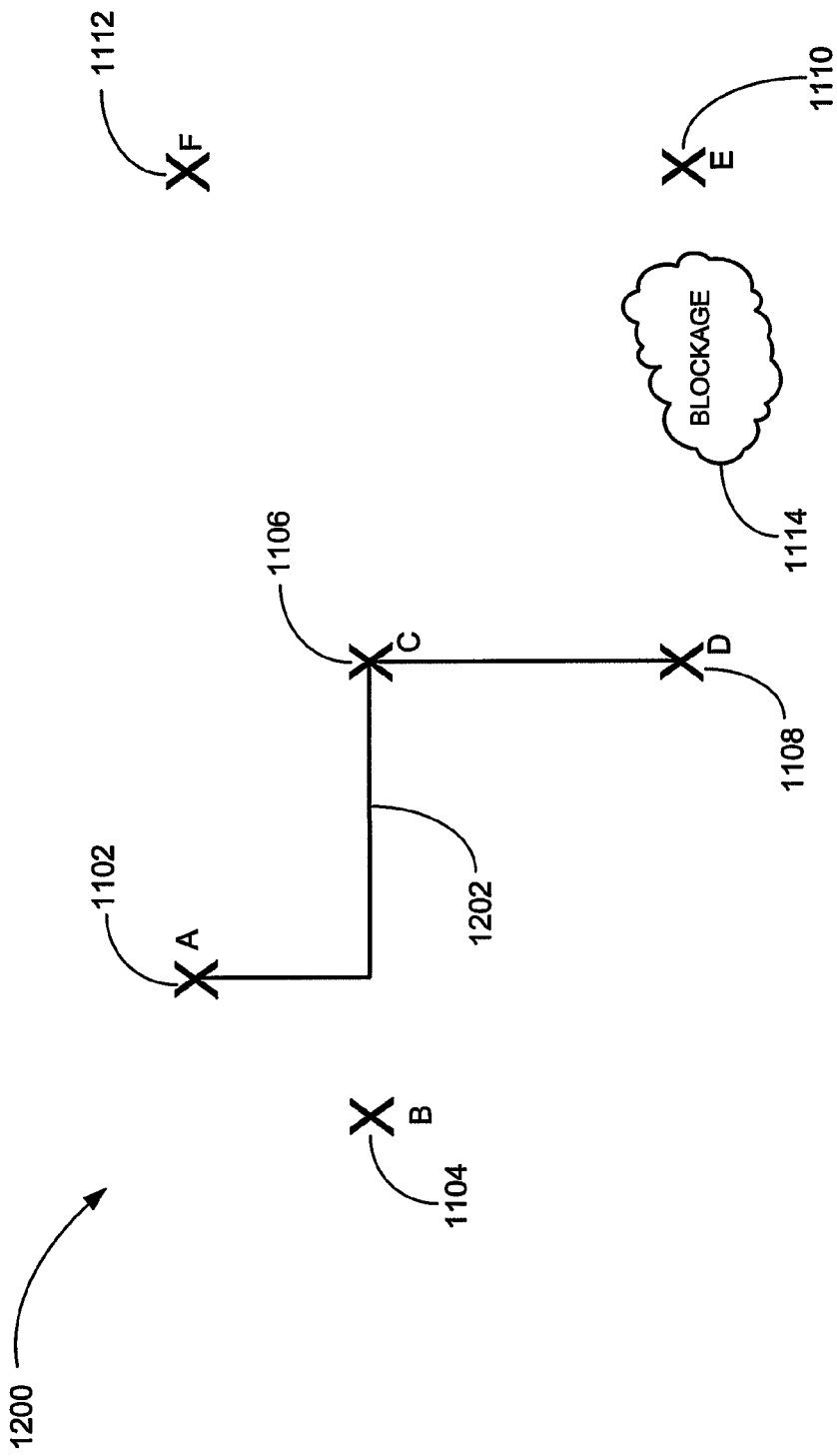
Figure 13:
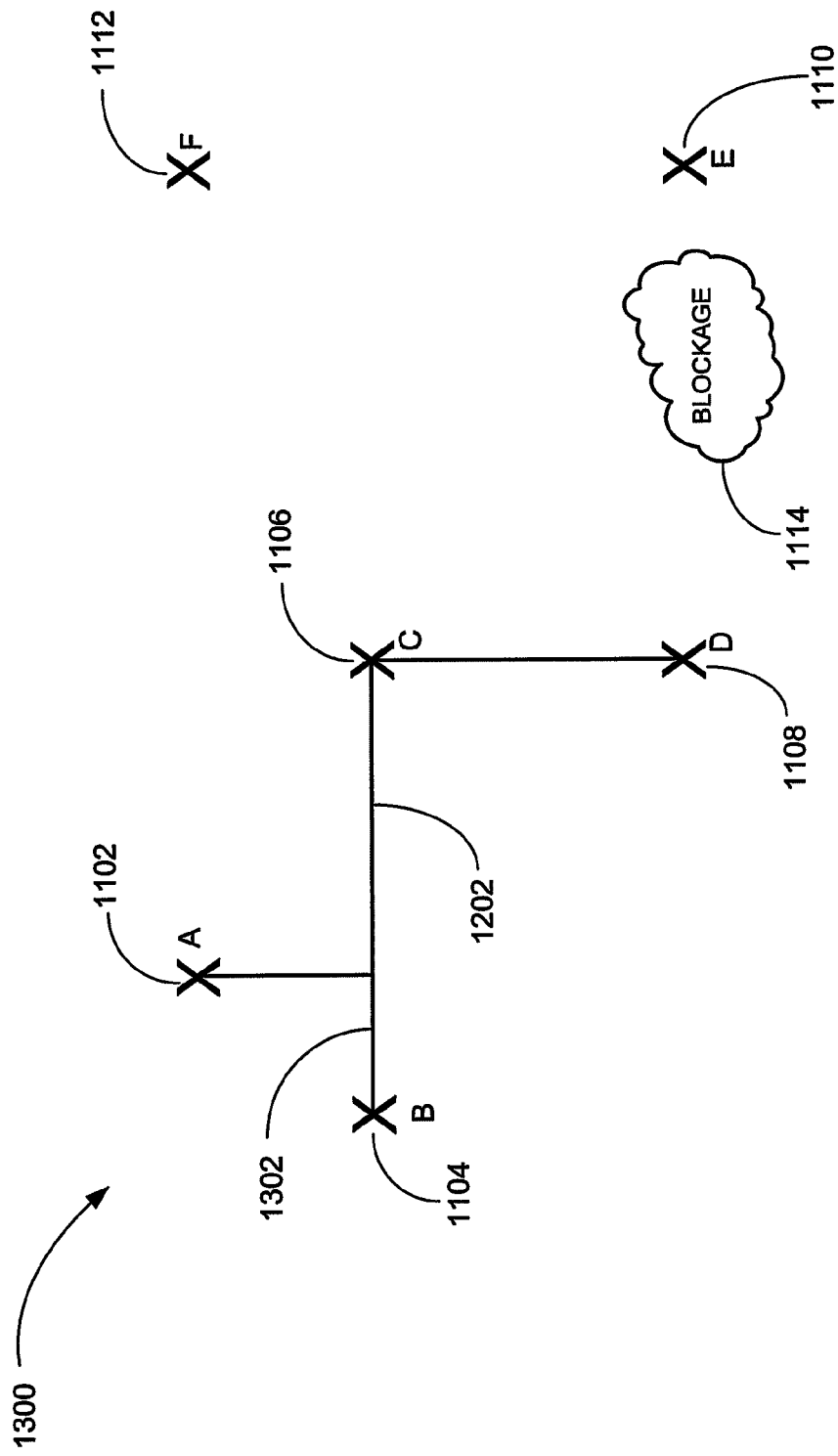
Figure 14:
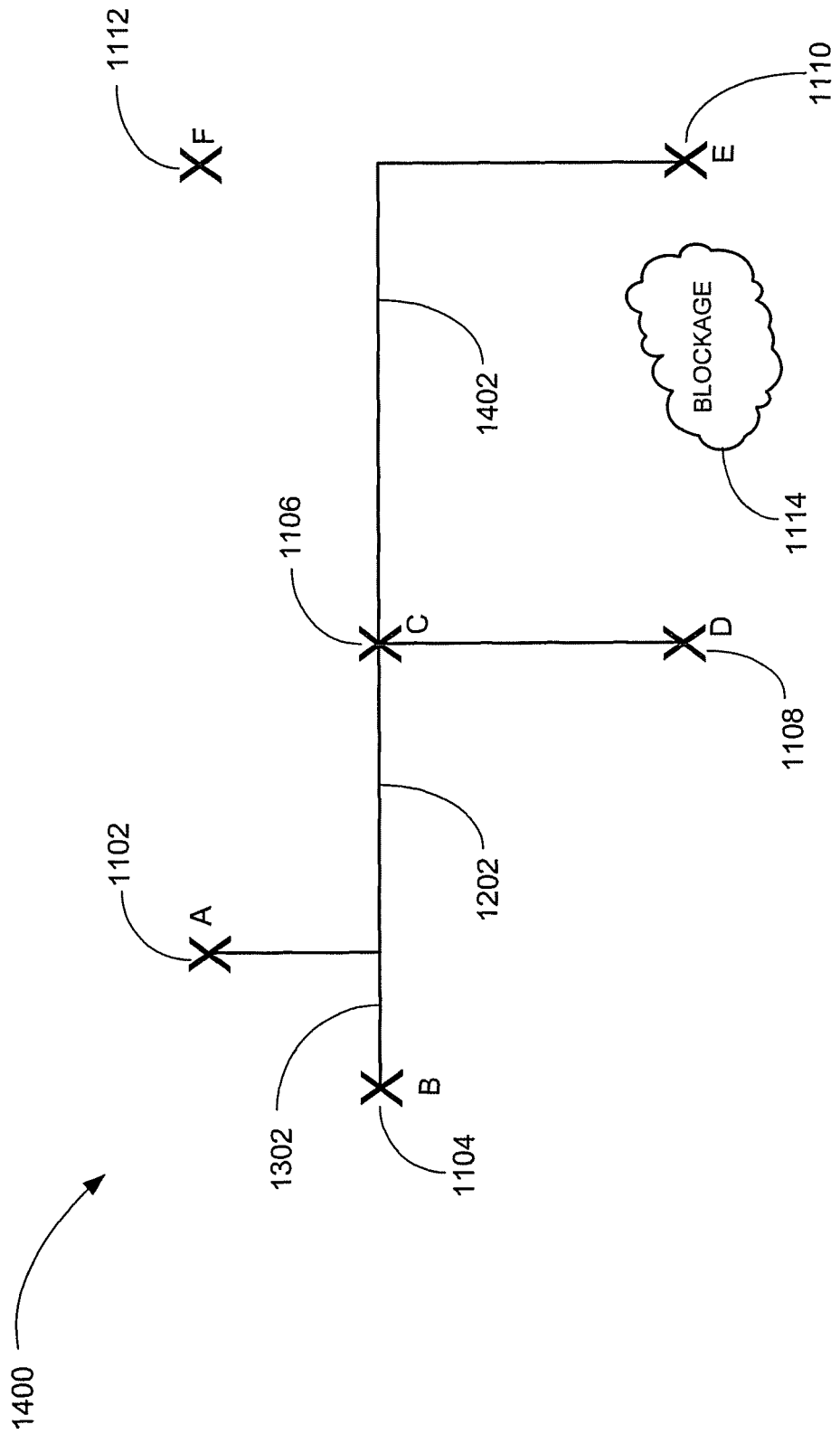

In FIG. 12, a style route 1202 in a Z-shape (See FIG. 9) is generated between the cell 1102 and the cell 1108 with the cell 1106 being in-between. A style route 1302 is generated as a straight line in FIG. 13 and added to the style route 1202 to connect the cell 1106. An inverted L route 1402 is generated and added between the cells as shown in FIG. 14. The version of the routing the cell placement shown in a cell placement 1400 is thus complete.

Figure 15:
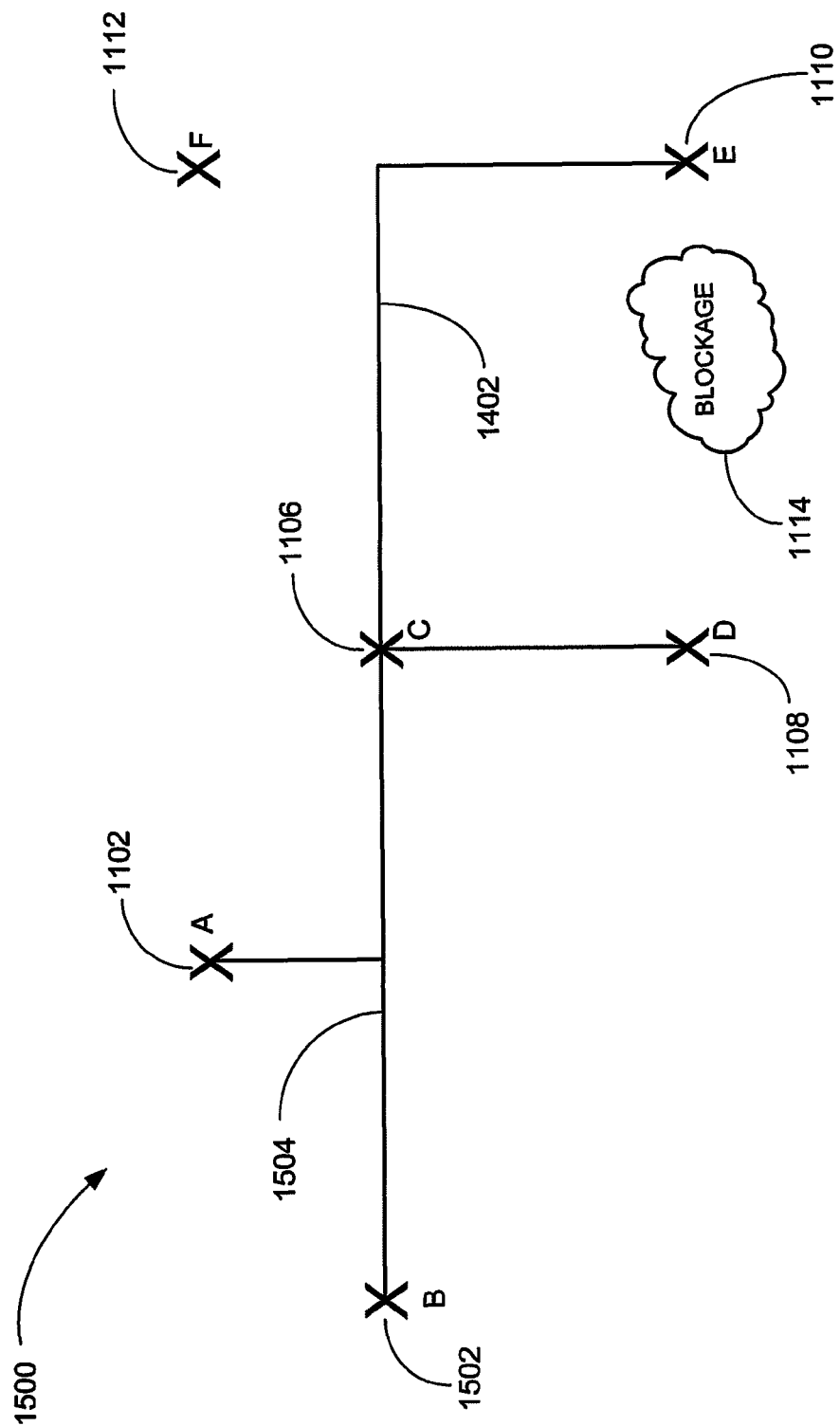

A change in the floorplan associated with the cell placement 1400 may result in the cell 1104 moving further left. An updated cell placement 1500 reflecting the cell 1104 in a new position and designated as a cell 1502 is shown in FIG. 15. In addition, the style route 1302 is shown elongated as a style route 1502. The methods and systems described above are flexible enough to generate the style route 1504. In some embodiments, the routing rule associated with the style route 1302 is not need to change to generate the style route 1502 despite the modified cell placement.

Figure 16:
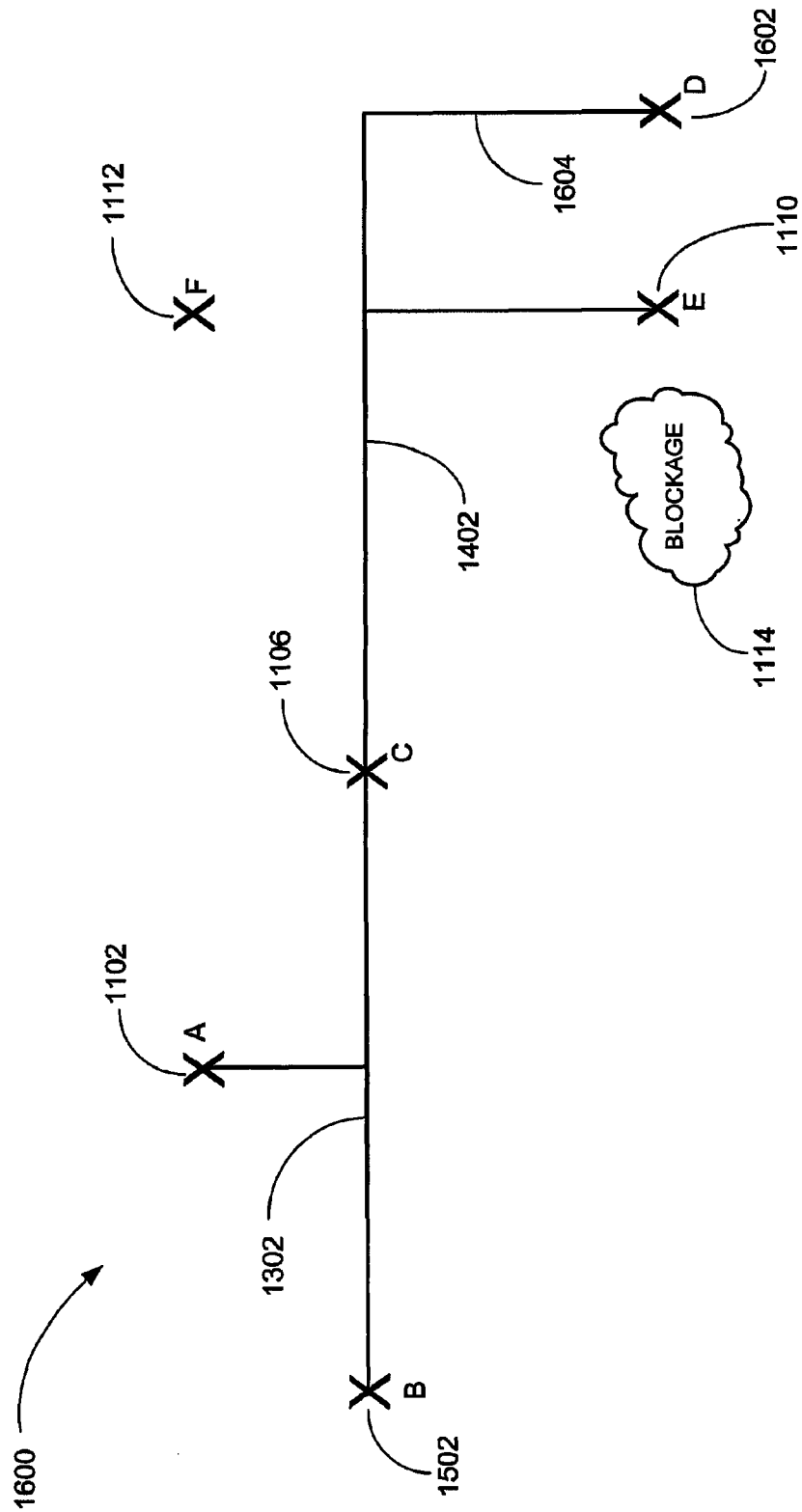

A change in the floorplan associated with the cell placement 1500 may result in the cell 1108 moving to the right. An updated cell placement 1600 reflecting the cell 1108 in a new position and designated as a cell 1602 is shown in FIG. 16. In addition, the style route 1202 is shown elongated as a style route 1602. The routing rule provides sufficient flexibility to generate the style route 1602. In some embodiments, the routing rule associated with the style route 1202 is not changed to generate the style route 1602.

Figure 17:
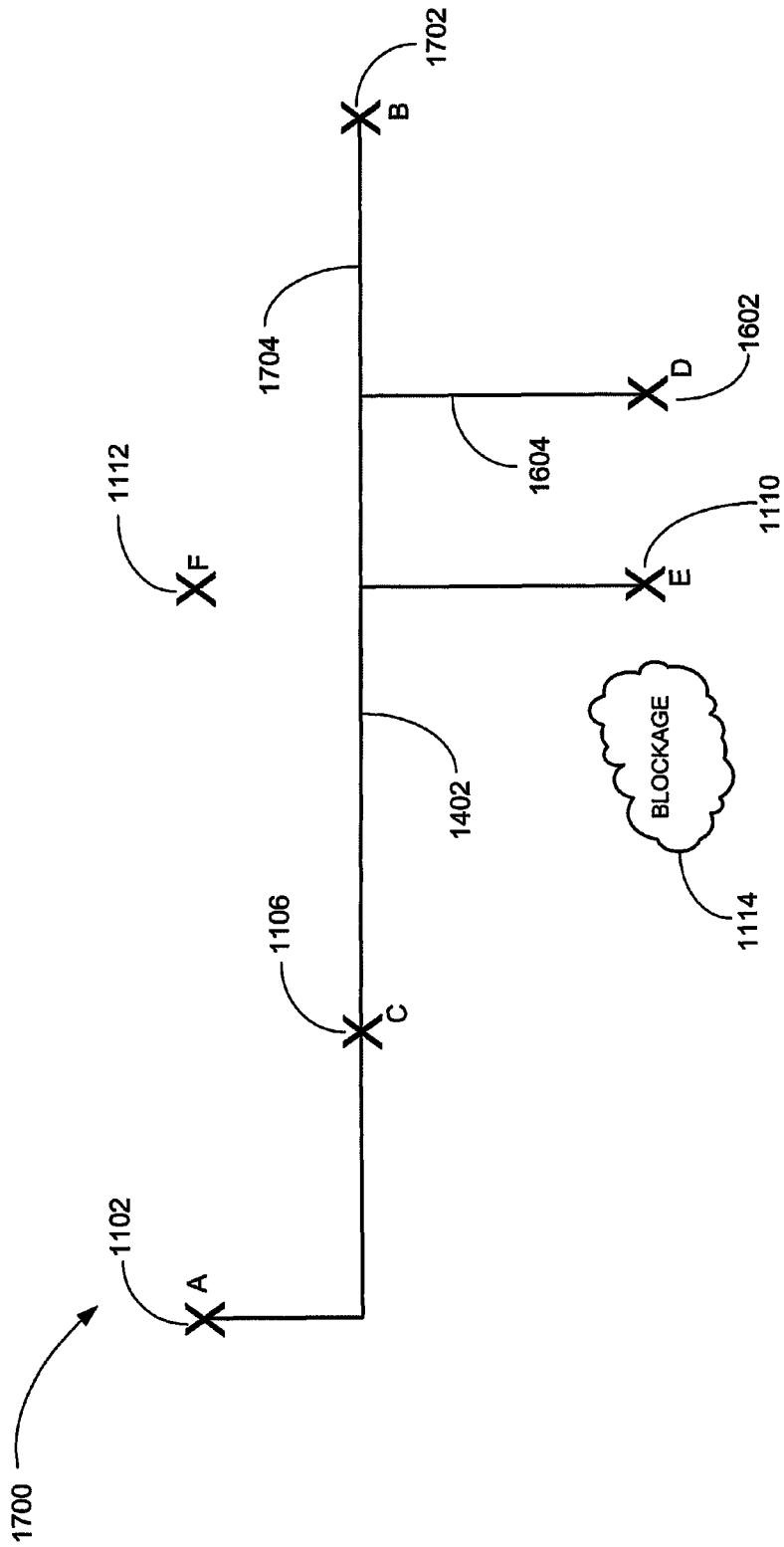

A change in the floorplan associated with the cell placement 1600 may result in the cell 1502 moving to the right. An updated cell placement 1700 reflecting the cell 1502 in a new position and designated as a cell 1702 is shown in FIG. 17. In addition, the style route 1302 is shown as a style route 1704. In some embodiments, the routing rule associated with the style route 1302 is not changed to generate the style route 1704.

Figure 18:
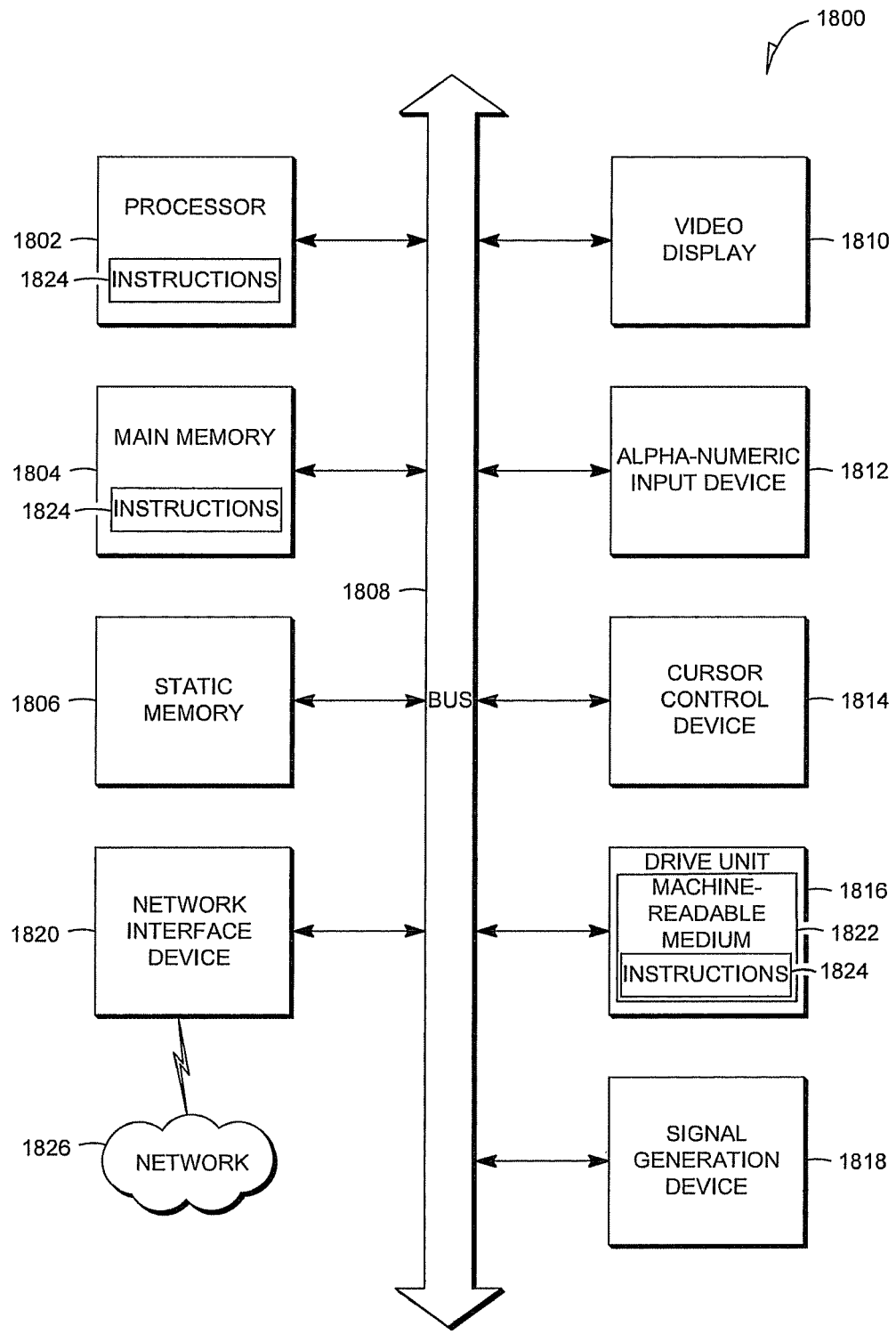
FIG. 18 is a block diagram of a machine in the example form of a computer system within which a set of instructions for causing the machine to perform any one or more of the methodologies discussed herein may be executed.

FIG. 18 shows a block diagram of a machine in the example form of a computer system 1800 within which a set of instructions may be executed causing the machine to perform any one or more of the methods, processes, operations, or methodologies discussed herein. The operator device 102, the design device 106, and/or the analysis device 112 may include the functionality of the one or more computer systems 1800 (see FIG. 1).

In an example embodiment, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a server computer, a client computer, a personal computer (PC), a tablet PC, a set-top box (STB), a Personal Digital Assistant (PDA), a cellular telephone, a web appliance, a network router, switch or bridge, a kiosk, a point of sale (POS) device, a cash register, an Automated Teller Machine (ATM), or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 1800 includes a processor 1810 (e.g., a central processing unit (CPU) a graphics processing unit (GPU) or both), a main memory 1804 and a static memory 1806, which communicate with each other via a bus 1806. The computer system 1800 may further include a video display unit 1808 (e.g., a liquid crystal display (LCD) or a cathode ray tube (CRT)). The computer system 1800 also includes an alphanumeric input device 1810 (e.g., a keyboard), a cursor control device 1812 (e.g., a mouse), a drive unit 1814, a signal generation device 1816 (e.g., a speaker) and a network interface device 1820.

The drive unit 1814 includes a machine-readable medium 1822 on which is stored one or more sets of instructions (e.g., software 1824) embodying any one or more of the methodologies or functions described herein. The software 1824 may also reside, completely or at least partially, within the main memory 1804 and/or within the processor 1810 during execution thereof by the computer system 1800, the main memory 1804 and the processor 1810 also constituting machine-readable media.

The software 1824 may further be transmitted or received over a network 1826 via the network interface device 1820.

While the machine-readable medium 1822 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing or encoding a set of instructions for execution by the machine and that cause the machine to perform any one or more of the methodologies of the present invention. The term "machine-readable medium" shall accordingly be taken to include, but not be limited to, solid-state memories, and optical media, and magnetic media.

Certain systems, apparatus, applications or processes are described herein as including a number of modules. A module may be a unit of distinct functionality that may be presented in software, hardware, or combinations thereof. When the functionality of a module is performed in any part through software, the module includes a machine-readable medium. The modules may be regarded as being communicatively coupled.

In an example embodiment, a routing selection is received. The routing selection is for a path between at least a first cell and a second cell. The first and second cell are associated with a functional description of an integrated circuit. A floorplan associated with the functional description is modified to create a modified floorplan. The modified floorplan has a physical design change relative to the floorplan. A pre-route is automatically generated based on receipt of the routing selection and the modified floorplan. The pre-route is added to a physical design of the chip to create a pre-routed physical design.

Thus, methods and systems for flexible and repeatable pre-route generation have been described. Although embodiments of the present invention have been described with reference to specific example embodiments, it will be evident that various modifications and changes may be made to these embodiments without departing from the broader spirit and scope of the embodiments of the invention. Accordingly, the specification and drawings are to be regarded in an illustrative rather than a restrictive sense.

In the above description, for purposes of explanation, numerous specific details are set forth in order to provide a thorough understanding of example embodiments. It will be evident, however, to one of ordinary skill in the art that embodiments of the invention may be practiced without these specific details.

Various activities described with respect to the methods identified herein can be executed in serial or parallel fashion. Although "End" blocks are shown in the flowcharts, the methods may be performed continuously.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus, the following claims are hereby incorporated into the Detailed Description, with each claim standing on its own as a separate embodiment.

What is claimed is:

1. A method comprising:
receiving a routing selection, the routing selection being for a path between at least a first cell and a second cell, the first and second cell being associated with a functional description of an integrated circuit;
modifying a floorplan associated with the functional description to create a modified floorplan, the modified floorplan having a physical design change relative to the floorplan;
automatically generating a pre-route based on receipt of the routing selection and the modified floorplan using a processor; and
adding the pre-route to a physical design of the chip to create a pre-routed physical design, the pre-route being generated and added to the physical design prior to generation and addition of a plurality of additional floorplan routes to the physical design.

2. The method of claim 1, further comprising:
generating the plurality of additional floorplan routes based on the modified floorplan; and
adding the plurality of additional floorplan routes to the pre-routed physical design of the chip.

3. The method of claim 1, further comprising:
accessing routing constraints that define conditions for the pre-route to meet,
wherein generation of the pre-route is based on the receipt of the routing selection, the modification, and the routing constraints.

4. The method of claim 1, wherein the routing selection is received from a user.

5. The method of claim 1, further comprising:
establishing a pre-routing rule for the path between the first cell and the second cell of the floorplan route,
wherein generation of the pre-route is based on the pre-routing rule.

6. The method of claim 5, wherein the pre-routing rule is associated with at least one route shape, the at least one route shape specifying a three dimensional appearance of the path between the first cell and the second cell.

7. The method of claim 5, wherein the pre-routing rule specifies at least one of route layers, route width, route spacing, and route grid of the path, the specification of the route layers identifying a single layer or a plurality of layers of the physical design through which the path of the pre-route is to travel, the specification of the route width identifying a thickness of the path, the specification of the route spacing identifying an amount of space between the path and another path of the physical design, the specification of the route grid defining an acceptable space for routing the path.

8. The method of claim 1, further comprising:
creating a pre-routing rule for the path based on receipt of the routing selection,
wherein automatic generation of the pre-route is based on creation of the pre-routing rule and the modified floorplan.

9. The method of claim 1, further comprising:
determining route precedence of the modified floorplan, the pre-route having a greater route precedence than nonpreroute routes,
wherein addition of the pre-route is based on a determination of the route precedence.

10. The method of claim 1, wherein modifying the floorplan comprises:
modifying placement of at least a portion of a plurality of cells of the floorplan of the chip design to create the modified floorplan.

11. The method of claim 1, further comprising:
determining that the floorplan has an error,
wherein modification of the floorplan is based on a determination that the floorplan has the error.

12. The method of claim 1, further comprising:
determining that the floorplan does not meet a performance specification,
wherein modification of the floorplan is based on a determination that the floorplan does not meet the performance specification.

13. The method of claim 1, wherein the pre-route has the same path as the path of the routing selection.

14. The method of claim 1, wherein a pre-route path of the pre-route has the same performance as the path associated with the routing selection.

15. A non-transitory machine-readable medium comprising instructions, which when executed by one or more processors, cause the one or more processors to perform the following operations:
receive a routing selection, the routing selection being for a path between at least a first cell and a second cell, the first and second cell being associated with a functional description of an integrated circuit;
modify a floorplan associated with the functional description to create a modified floorplan, the modified floorplan having a physical design change relative to the floorplan;
automatically generate a pre-route based on receipt of the routing selection and the modified floorplan; and
add the pre-route to a physical design of the chip to create a pre-routed physical design, the pre-route being generated and added to the physical design prior to generation and addition of a plurality of additional floorplan routes to the physical design.

16. The machine-readable medium of claim 15, wherein the pre-route is a trunk and the plurality of additional floorplan routes are a plurality of branches associated with the trunk.

17. A system comprising:
a processor coupled to a memory;
a route selection module deployed in the memory and executed by the processor to receive a routing selection, the routing selection being for a path between at least a first cell and a second cell, the first and second cell being associated with a functional description of an integrated circuit;
a floorplan module deployed in the memory and executed by the processor to modify a floorplan associated with the functional description to create a modified floorplan, the modified floorplan having a physical design change relative to the floorplan;
a pre-routing module deployed in the memory and executed by the processor to automatically generate a pre-route based on receipt of the routing selection and the modified floorplan; and
a route addition module deployed in the memory and executed by the processor to adding the pre-route to a physical design of the chip to create a pre-routed physical design, the pre-route being generated and added to the physical design prior to generation and addition of a plurality of additional floorplan routes to the physical design.

18. The system of claim 17, wherein the functional description is in netlist format.

* * * * *

UNITED STATES PATENT AND TRADEMARK OFFICE
CERTIFICATE OF CORRECTION

PATENT NO. : 8,627,255 B2  
APPLICATION NO. : 12/916317  
DATED : January 7, 2014  
INVENTOR(S) : Vedantam et al.

Page 1 of 1

It is certified that error appears in the above-identified patent and that said Letters Patent is hereby corrected as shown below:

On Title page, column 1, under Inventors, lines 4-5, delete "Wanyun Singh," and insert -- Wanyun Shih, --, therefor.

Signed and Sealed this  
Twenty-second Day of July, 2014

Michelle K. Lee  
*Deputy Director of the United States Patent and Trademark Office*